US008853089B2

United States Patent
Ohtsuki et al.

(10) Patent No.: US 8,853,089 B2
(45) Date of Patent: Oct. 7, 2014

(54) MANUFACTURING METHOD OF SEMICONDUCTOR SUBSTRATE

(75) Inventors: Hiroshi Ohtsuki, Okazaki (JP); Takumi Shibata, Miyoshi (JP)

(73) Assignee: DENSO CORPORATION, Kariya (JP)

( * ) Notice: Subject to any disclaimer, the term of this patent is extended or adjusted under 35 U.S.C. 154(b) by 112 days.

(21) Appl. No.: 13/541,885

(22) Filed: Jul. 5, 2012

(65) Prior Publication Data

US 2013/0012004 A1  Jan. 10, 2013

(30) Foreign Application Priority Data

Jul. 10, 2011 (JP) ................... 2011-152409
May 22, 2012 (JP) ................... 2012-116822

(51) Int. Cl.
| | |
|---|---|
| H01L 21/306 | (2006.01) |
| H01L 29/78 | (2006.01) |
| H01L 29/66 | (2006.01) |
| H01L 21/3065 | (2006.01) |
| H01L 29/06 | (2006.01) |
| H01L 29/10 | (2006.01) |

(52) U.S. Cl.
CPC ........ *H01L 21/3065* (2013.01); *H01L 29/7813* (2013.01); *H01L 29/66734* (2013.01); *H01L 29/0634* (2013.01); *H01L 21/30604* (2013.01); *H01L 29/1095* (2013.01)
USPC .......................................... 438/700; 438/715

(58) Field of Classification Search
USPC .......................................... 438/753, 700, 715
See application file for complete search history.

(56) References Cited

U.S. PATENT DOCUMENTS

| | | | |
|---|---|---|---|
| 2002/0106892 A1 | 8/2002 | Shibata et al. | |
| 2002/0158301 A1 | 10/2002 | Urakami et al. | |
| 2004/0110358 A1* | 6/2004 | Lee | 438/437 |
| 2004/0229420 A1 | 11/2004 | Shibata | |

FOREIGN PATENT DOCUMENTS

| | | |
|---|---|---|
| JP | A-08-203863 | 8/1996 |
| JP | 2002-231945 A | 8/2002 |
| JP | A-2003-282869 | 10/2003 |
| JP | A-2006-019610 | 1/2006 |

OTHER PUBLICATIONS

Office Action mailed by the Japanese Patent Office on Feb. 4, 2014 in the corresponding Japanese Patent Application No. 2012-116822 (and English translation).

* cited by examiner

*Primary Examiner* — Zandra Smith
*Assistant Examiner* — Toniae Thomas
(74) *Attorney, Agent, or Firm* — Posz Law Group, PLC

(57) ABSTRACT

A manufacturing method of a semiconductor substrate includes: forming a trench in a semiconductor board by a dry etching method; etching a surface portion of an inner wall of the trench by a chemical etching method so that a first damage layer is removed, wherein the surface portion has a thickness equal to or larger than 50 nanometers; and performing a heat treatment at temperature equal to or higher than 1050° C. in non-oxidizing and non-azotizing gas so that crystallinity of a second damage layer is recovered, wherein the second damage layer is disposed under the first damage layer. The crystallinity around the trench is sufficiently recovered.

22 Claims, 6 Drawing Sheets

MANUFACTURING METHOD OF SEMICONDUCTOR SUBSTRATE

CROSS REFERENCE TO RELATED APPLICATIONS

This application is based on Japanese Patent Applications No. 2011-152409 filed on Jul. 10, 2011, and No. 2012-116822 filed on May 22, 2012, the disclosures of which are incorporated herein by reference.

TECHNICAL FIELD

The present disclosure relates to a manufacturing method of a semiconductor substrate having an epitaxial film in a trench.

BACKGROUND

A manufacturing method of a semiconductor substrate is described in, for example, JP-A-2002-124474 (corresponding to US 2002/0158301) and JP-A-2006-19610. In the method, a trench is formed in the substrate, and an epitaxial film having high crystallinity is embedded in the trench. These two documents describe an object to provide the manufacturing method of the semiconductor substrate having a super junction (SJ) structure with PN columns. The substrate is suitably used for a semiconductor device having high break down voltage and low on-state resistance.

In the manufacturing method described in JP-A-2002-124474, a trench is formed in a silicon substrate. A mask made of an oxide film used in a trench process is removed. After that, a heat treatment is performed at temperature in a range between 900° C. and 1100° C. for a few minutes to tens minutes under reduced atmospheric pressure in non-oxidizing gas or non-azotizing gas. This heat treatment provides to smoothing an inner wall of the trench, which is roughened in the trench etching process. Then, the epitaxial film is embedded in the trench, so that the crystallinity of the epitaxial film is improved when the epitaxial film is grown in the trench.

In the manufacturing method described in JP-A-2006-19610, after a trench is formed in a silicon substrate, an inner wall of the trench is etched by a few nanometers to one micrometer with an etching gas including halogen gas such as HCl gas or $Cl_2$ gas in a gas furnace chamber at around 1000° C. Thus, the inner wall of the trench is cleaned. Then, an epitaxial film is grown in the trench so that the trench is filled with the epitaxial film having high crystal quality without any void in the trench.

It is necessary to form a trench having a high aspect ratio in order to provide the PN columns in the SJ structure of the semiconductor substrate in JP-A-2002-124474 and JP-A-2006-19610, compared with a trench for forming a trench gate structure. When the trench having the high aspect ratio for the PN columns is formed, occurrence of crystal defects caused by an anisotropic etching process increases. In order to generate a depletion layer in the PN columns so that the device has the high break down voltage, it is important to restrict from inducing leak current. Since the PN columns do not include an insulation film, that is different from the trench gate structure, it is very important to restrict from generating crystal defects in the PN columns. Here, the crystal defects induce the leak current. However, it is not sufficient in the manufacturing method described in each of JP-A-2002-124474 and JP-A-2006-19610 to restrict the crystal defects when the aspect ratio of the trench for the PN columns is high.

Thus, in the device in each of JP-A-2002-124474 and JP-A-2006-19610, it is not sufficient to remove a failure such as the leak current completely.

SUMMARY

It is an object of the present disclosure to provide a manufacturing method of a semiconductor substrate having an epitaxial film in a trench. The epitaxial film in the trench has high crystallinity.

According to an aspect of the present disclosure, a manufacturing method of a semiconductor substrate includes: forming a trench in a semiconductor board by a dry etching method; etching a surface portion of an inner wall of the trench by a chemical etching method so that a first damage layer is removed, wherein the surface portion has a thickness equal to or larger than 50 nanometers; and performing a heat treatment at temperature equal to or higher than 1050° C. in non-oxidizing and non-azotizing gas so that crystallinity of a second damage layer is recovered, wherein the second damage layer is disposed under the first damage layer.

In the above method, the surface portion around the trench has high crystallinity without defects. Thus, when an epitaxila film is formed in the trench, the epitaxial film also has high crystallinity without defects. Therefore, when PN columns are formed in the substrate, generation of leak current is restricted, so that the PN columns are completely depleted. Thus, the substrate provides a semiconductor device having high break down voltage.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

The present disclosure relates to a manufacturing method of a semiconductor substrate for forming a trench in a semiconductor substrate and filling the trench with an epitaxial film therein. Specifically, the method includes: a trench forming step for forming the trench in the semiconductor substrate by a dry-etching method; a first damage layer removing step for removing a first damage layer, the crystallinity of which is not recovered by heat treatment, by etching a surface layer of an inner wall of the trench 50 nanometers or more by a chemical etching method; and a second damage layer recover step for recovering crystallinity in a second damage layer, which is disposed under the first damage layer, by performing heat treatment at temperature equal to or higher than 1050° C. under atmosphere of non-oxidizing gas or non-azotizing gas after the first damage layer removing step.

A manufacturing method according to an embodiment will be explained with reference to drawings.

Figure 1A:
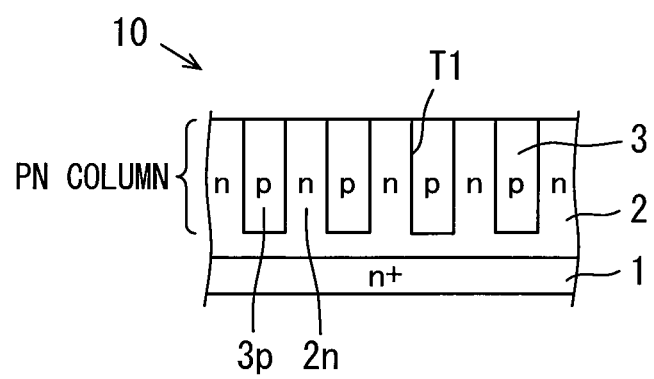
FIG. 1A is a diagram showing a cross sectional view of a semiconductor substrate.
Figure 1B:
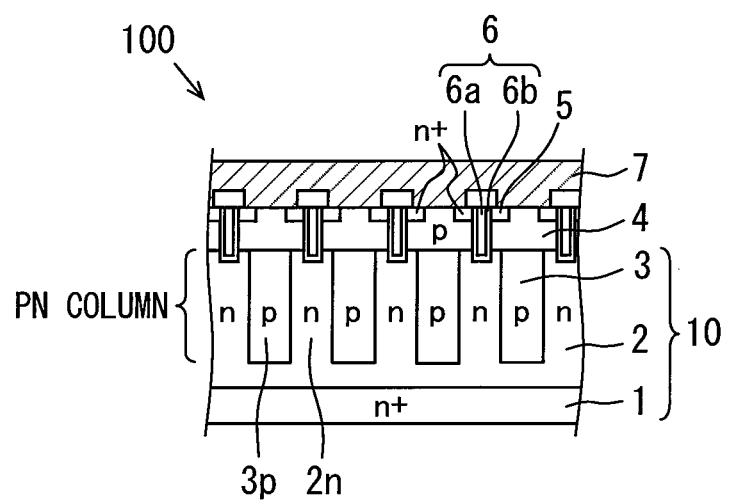
FIG. 1B is a diagram showing a cross sectional view of a semiconductor device having the substrate in FIG. 1A.

FIGS. 1A and 1B show a semiconductor substrate as a manufacturing object of the method. FIG. 1A is a cross sectional view of the semiconductor substrate 10, and FIG. 1b is a cross sectional view of a semiconductor device 100 having the substrate 10.

In the substrate 10 in FIG. 1A, an epitaxial layer 2 having a N conductive type is formed on a silicon substrate 1 having the N conductive type as a drain in the device 100. A P conductive type region 3p and a N conductive type region 2n are disposed in an upper portion of the epitaxial layer 2. The P conductive type region 3p and the N conductive type region 2n are repeatedly alternated in a stripe pattern, which is perpendicular to a sheet of the drawing in FIG. 1A. Thus, the P conductive type region 3p and the N conductive type region 2n provide PN columns. The PN columns are formed such that a trench T1 is formed in the epitaxial film 2, and then, another epitaxial film 3 having the P conductive type is formed in the trench T1 so that the epitaxial film 3 is embedded in the trench T1.

The substrate 10 in FIG. 1A provides the PN columns. When the PN columns are formed in the semiconductor substrate, the repeat pattern of the P conductive type region 3p and the N conductive type region 2n may be different from the stripe pattern. For example, one of the P conductive type region 3p and the N conductive type region 2n may be arranged in the other of the P conductive type region 3p and the N conductive type region 2n symmetrically in a dot manner. The shape of each dot may be any.

The device 100 in FIG. 1B is an example of semiconductor apparatus, which is manufactured by using the substrate in FIG. 1A. The device 100 is a N channel vertical MOSFET having the super junction structure provided by the PN columns.

In the device 100 in FIG. 1B, a body region 4 having the P conductive type as a channel forming layer is epitaxially formed on the PN columns. A gate electrode 6 provided by a gate oxide film 6b and an embedded poly crystal silicon film 6a has a trench gate structure. The gate electrode 6 penetrates the body region 4 and reaches the N conductive type region 2n in the PN columns. The emitter region 5 having the N conductive type is arranged in a surface portion of the body region 4 such that the emitter region 5 contacts the gate electrode 6. The emitter electrode 7 is connected to the emitter region 5 and the body region 4.

In the semiconductor device 100 having the vertical MOSFET structure with the PN columns, the N conductive type region 2n in the PN columns provides a drift region of a carrier, which passes through the body region 4, when a transistor turns on. When the transistor turns off, a whole of the PN columns depleted. In the vertical MOSFET structure having the PN columns, the semiconductor device 100 in FIG. 1B provides a high break down voltage and a low on-state resistance. Here, when the device 100 in FIG. 1B has the break down voltage of 600 volts, a width of the trench T1 in the substrate 10 in FIG. 1A, i.e., a width of each of the P conductive type region 3p and the N conductive type region 2n is 5 micrometers. A depth of each of the P conductive type region 3p and the N conductive type region 2n is 50 micrometers.

Here, in FIGS. 1A and 1B, the device 100, in which the N channel vertical MOSFET having the super junction structure provided by the PN columns is formed, is manufactured with using the substrate 10 having the PN columns in FIG. 1A. Alternatively, a P channel vertical MOSFET may be formed in the device 100 with using the substrate 10. The conductive type in the P channel vertical MOSFET is opposite to the N channel vertical MOSFET. In this case, the above advantages are also obtained. The substrate 10 having the PN columns may be used for another device. For example, the substrate 10 may be used for preparing an IGBT, a bipolar transistor, a GTP thyristor or a diode.

In the above embodiment, the manufacturing method of the semiconductor substrate 10 is provided. Alternatively, the manufacturing method of a wafer may be provided. A structure of a device formed in the substrate or the wafer may be different from the above described structure. Alternatively, a manufacturing process of the substrate may be different from the above described method.

A manufacturing method of the substrate 10 will be explained as follows. In the following method, the semiconductor material is silicon. The first conductive type provides the N conductive type, and the second conductive type provides the P conductive type. Even when the semiconductor material is different from silicon, and/or even when the first conductive type provides the P conductive type, and the second conductive type provides the N conductive type, the following manufacturing method is used for the substrate 10.

FIGS. 2A to 2C and FIGS. 3A to 3C are cross sectional views showing various steps in the manufacturing method of the substrate 10.

Figure 2A:
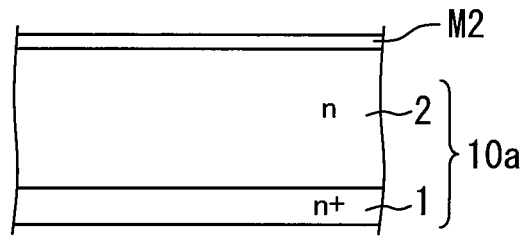
FIGS. 2A, 2B and 2C are diagrams showing a manufacturing method of the substrate.

When the substrate in FIG. 1A is manufactured, first, as shown in FIG. 2A, a semiconductor substrate 10a having a silicon substrate 1 is prepared. An epitaxial layer 2 having the N conductive type is formed on the silicon substrate 1 having the N conductive type.

Next, an oxide film M2 is formed on the epitaxial layer 2 by a thermal oxidation method, a CVD (chemical vapor deposition) method or the like. The oxide film M2 functions as a mask in a trench forming step in FIG. 2C. Alternatively, the mask may be made of an insulation film such as a nitride film other than the oxide film.

Figure 2B:
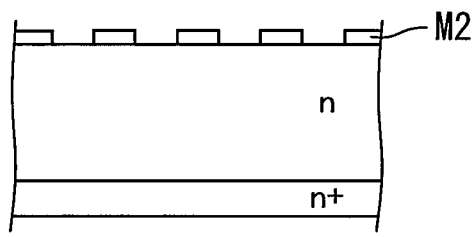

Next, as shown in FIG. 2B, openings are formed in the oxide film M2 by a photo lithography and etching method. The openings are arranged in a predetermined repeat pattern.

Figure 2C:
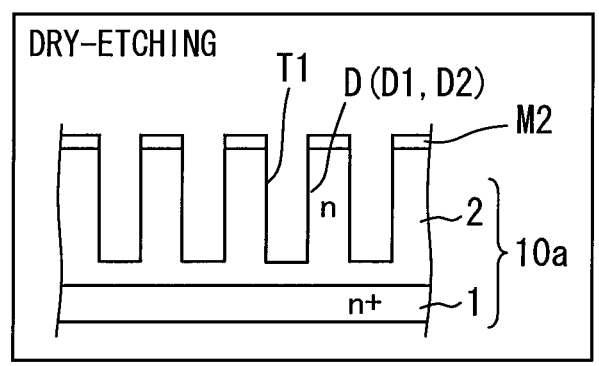

Next, as shown in FIG. 2C, in the trench forming step, the epitaxial layer 2 is etched by a dry-etching method with using the oxide film M2 as a mask. Thus, a trench T1 having a predetermined depth is formed in the epitaxial layer 2.

The above dry-etching method may be an anisotropic plasma etching method, a RIE (reactive ion etching) method or the like. In the dry-etching method such as the RIE method and the plasma etching method, an etching direction can be determined by directionality of an ion beam or plasma. Thus, since the etching direction is not affected by chemical property and crystal plane orientation, the designing degree of freedom in the device is made higher than an anisotropic wet etching method.

Further, the mask in the trench forming step may be made of the oxide film or the nitride film. With using the mask, the trench T1 having high accuracy of dimensions is formed.

Figure 3A:
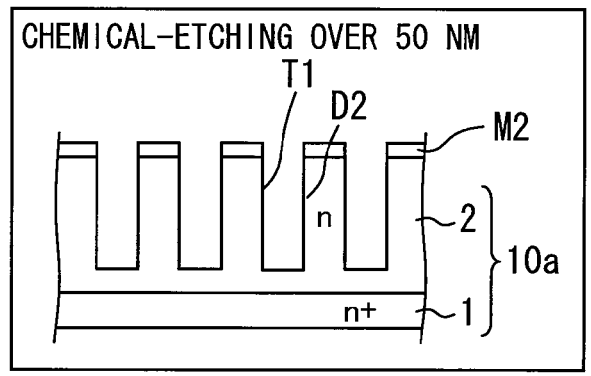
FIGS. 3A, 3B and 3C are diagrams showing a manufacturing method of the substrate.
Figure 3B:
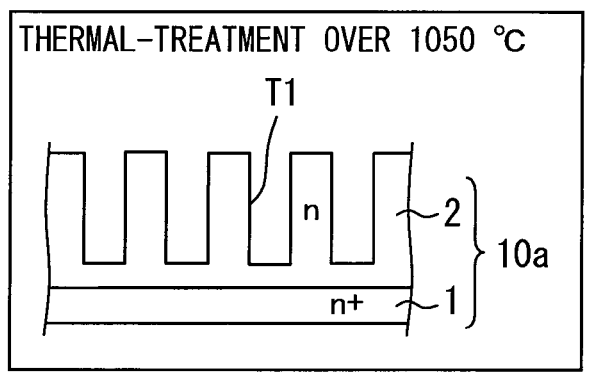

In the manufacturing method of the semiconductor substrate 10 in FIGS. 2A to 3C, the second damage layer recover step in FIG. 3B provides the high temperature heat treatment at temperature equal to or higher than 1050° C. Thus, the shape of the trench T1 may become a reverse tapered shape. Accordingly, in the trench forming step in FIG. 2C, process conditions are appropriately determined so that the trench T1 has a tapered shape. Thus, even when the heat treatment at 1050° C. or higher is performed in the second damage layer recover step in FIG. 3B, the trench shape does not become the reverse tapered shape.

In the trench forming step in FIG. 2C, a damage layer D is formed in a surface portion of the inner wall of the trench T1, which is formed in the epitaxial layer 2. The crystallinity of the surface portion of the inner wall of the trench T1 is reduced by the dry etching in the trench forming process.

Figure 4:
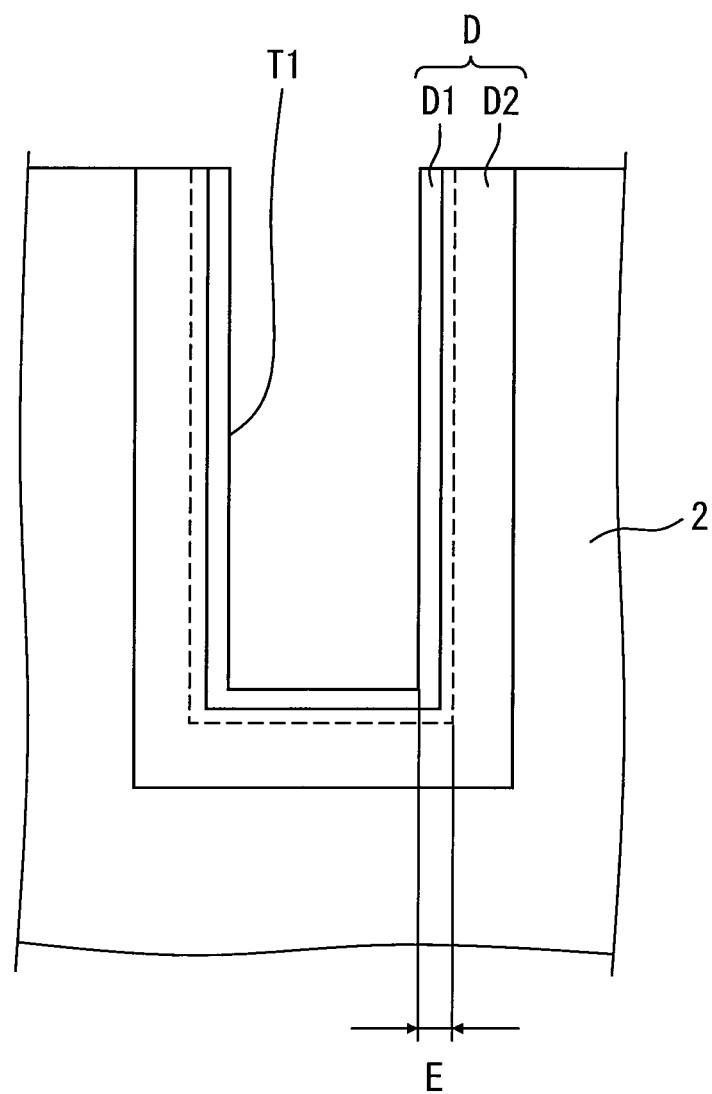
FIG. 4 is a diagram showing a partially enlarged cross sectional view of a damage layer around a trench just after the trench is formed by a dry-etching method.

FIG. 4 shows a partially enlarged view of the trench T1. This view of the trench T1 is considered by inventors. FIG. 4 shows the damage layer D just after the trench T1 is formed by the dry etching method. An oxide film M2 is not shown in FIG. 4.

As shown in FIG. 4, the damage layer D includes a first damage layer D1 and a second damage layer D2. The first damage layer D1 is disposed on a surface side of the inner wall of the trench T1, and the second damage layer D2 is disposed under the first damage layer D1. The first damage layer D1 is a defective layer having high damage. When temperature increases, the defects in the first damage layer D1 easily grow up since an internal stress increases. Thus, the defects expand so that the crystallinity of the first damage layer D1 becomes much worse. Accordingly, even when the heat treatment at high temperature is performed, the crystallinity is not recovered in the first damage layer D1. The second damage layer D2 is a defective layer having low damage. The second damage layer D2 includes micro defects. The second damage layer D2 is disposed from the surface of the trench T1 to a portion equal to or deeper than one micrometer from the surface. However, the crystallinity of the second damage layer D2 can be recovered by the heat treatment at high temperature.

In the manufacturing method of the semiconductor substrate 10 having the epitaxial film 3 embedded in the trench T1 shown in FIG. 1, the crystallinity of the epitaxial film 3 depends on the crystallinity of the surface of the trench T1 since the surface of the trench T1 provides an original point of the crystal growth of the epitaxial film 3. Accordingly, a key point to restrict the defects from remaining in the substrate 10 is to recover the crystallinity around the trench T1 sufficiently before forming the epitaxial film 3 in the trench T1 although the crystallinity around the trench T1 is reduced by the dry etching process.

Thus, after the trench forming step in FIG. 2C is performed, the first damage layer removing step in FIG. 3A is performed such that the surface portion of the trench T1 is etched equal to or more than 50 nanometers by the chemical etching method.

The chemical etching method in the first damage layer removing step is performed with, for example, radicals mainly. The etching method with using the radicals mainly is, for example, a chemical dry etching (CDE) method at temperature equal to or lower than 120° C.

The etchant of the CDE method may be radicals of halogen. Specifically, the radicals of halogen may be radicals of fluorine, which is prepared by decomposing mixed gas of carbon tetrafluoride ($CF_4$) and oxygen ($O_2$) by a discharging method. Alternatively, the radicals of halogen may be radicals of chlorine (Cl), which is prepared by decomposing mixed gas of hydrogen chloride (HCl) and chlorine ($Cl_2$) by a discharging method.

The chemical etching method in the first damage layer removing step is, for example, an isotropic wet etching method. The etchant in the wet etching method may be nitric hydrofluoric acid (mixed acid of hydrofluoric acid and nitric acid) or mixed acid of hydrofluoric acid and acetic acid.

The chemical etching in the first damage layer removing step may be performed by a vapor process with using halogen gas. Further, the halogen gas may be hydrogen fluoride gas, hydrogen chloride gas, or chlorine gas.

In the following example, the surface portion of the trench T1 is etched by the CDE (chemical dry etching) method at temperature equal to or lower than 120° C. Thus, the first damage layer D1 in FIG. 4 is removed.

FIG. 4 shows a to-be-removed portion of the epitaxial layer 2 around the trench T1, which is represented by a broken line in FIG. 4. The to-be-removed portion provides an etching amount E, and is etched by the CDE method in the first damage layer removing step in FIG. 3A.

When the first damage layer removing step in FIG. 3A is performed by the CDE method, the first damage layer D1 in FIG. 4 may be etched by the radicals of fluorine, which is prepared by decomposing mixed gas of carbon tetrafluoride ($CF_4$) and oxygen ($O_2$) by a discharging method.

The CDE method is an isotropic etching method according to chemical reaction. Thus, the silicon material in the epitaxial layer 2 is not damaged by the CDE method. The fluorine radicals are provided by a light element in the etching process, compared with the radicals of chlorine (Cl), which is prepared by decomposing mixed gas of hydrogen chloride (HCl) and chlorine ($Cl_2$) by a discharging method. Thus, the fluorine radicals provide the etching process for homogeneously etching the surface of the trench T1 having large depth at low temperature.

When the first damage layer removing step is performed by the CDE method, the process temperature in the CDE method may be equal to or higher than 60° C. and equal to or lower than 100° C. In this case, the etching speed and reduction of thermal load are balanced. The atmospheric pressure of the CDE method may be equal to or higher than 0.01 Torr and equal to or lower than 10 Torr. Specifically, when the atmospheric pressure of the CDE method is equal to or higher than 0.1 Torr and equal to or lower than 1 Torr, it is preferable.

When the first damage layer removing step in FIG. 3A is performed by the wet etching method, the first damage layer D1 in FIG. 4 may be etched by the etchant of nitric hydrofluoric acid (mixed acid of hydrofluoric acid and nitric acid) or mixed acid of hydrofluoric acid and acetic acid.

The wet etching method is an isotropic etching method according to chemical reaction. Thus, the silicon material in the epitaxial layer 2 is not damaged by the wet etching method. The etching process with using the etchant of nitric hydrofluoric acid or mixed acid of hydrofluoric acid and acetic acid homogeneously etches the surface of the trench T1 having large depth.

When the first damage layer removing step in FIG. 3A is performed by the vapor process with using the halogen gas, the halogen gas may be hydrogen fluoride gas, hydrogen chloride gas, or chlorine gas. The etching process of the vapor process with using the halogen gas such as hydrogen fluoride gas, hydrogen chloride gas, or chlorine gas, is an isotropic etching method according to chemical reaction. Thus, the silicon material in the epitaxial layer 2 is not damaged by the vapor process. The etching process of the vapor process with using the halogen gas homogeneously etches the surface of the trench T1 having large depth.

The etching amount E of the surface portion of the trench T1 in FIG. 4 in the first damage layer removing step of FIG. 3A may be sufficiently large in order to remove the defects completely. If the etching amount E is excessively large, the etching time becomes long. Accordingly, when the trench is formed for preparing the PN columns, the etching amount E may be minimum necessary for separating adjacent trenches so that the adjacent trenches in the repeat pattern do not adhere to each other.

Next, after the first damage layer removing step in FIG. 3A, the oxide film M2 is removed by a wet etching method. Then, in the second damage layer recover step in FIG. 3B, the heat treatment at temperature equal to or higher than 1050° C. under non-oxidizing and non-azotizing gas is performed in the semiconductor substrate 10a, so that the crystallinity of the second damage layer D2 under the first damage layer D1 is recovered. The heat treatment at high temperature in the non-oxidizing and non-azotizing gas is performed such that the high temperature anneal process is executed in hydrogen atmosphere or argon atmosphere. When the heat treatment is performed in the hydrogen atmosphere, residue of the silicon oxide is removed sufficiently. The heat treatment time is equal to or longer than three minutes. The process time of the heat treatment may be requisite minimum.

In the above method, the etching amount E of the surface portion of the trench T1 in the first damage layer removing step in FIG. 3A and the recovery state of the crystallinity of the second damage layer D2 in the heat treatment of the second damage layer recover step in FIG. 3B have correlation. Specifically, the etching amount of the surface portion of the trench T1 in the first damage layer removing step is defined as E nanometers, and the heat treatment temperature of the second damage layer recover step is defined as A ° C. When equations of "E>=100" and "A>=−0.3×E+1100" are satisfied, the first damage layer D1 is sufficiently and surely removed, and the crystallinity of the second damage layer D2 is sufficiently recovered, so that the defective rate caused by the current leak is zero percent.

The oxide film M2 used for the mask in the wet etching process may be removed before the second damage layer recover step is performed. When the mask is removed before the second damage layer recover step, the peel off of the mask in the second damage layer recover step is restricted. Further, reduction of the crystallinity of a portion of the trench T1 around an opening of the trench T1 is restricted. When the heat treatment is performed in the hydrogen gas, and the mask is removed before the second damage layer recover step, a trouble that an removed part of the mask is adhered to the trench T1 again is restricted.

Figure 3C:
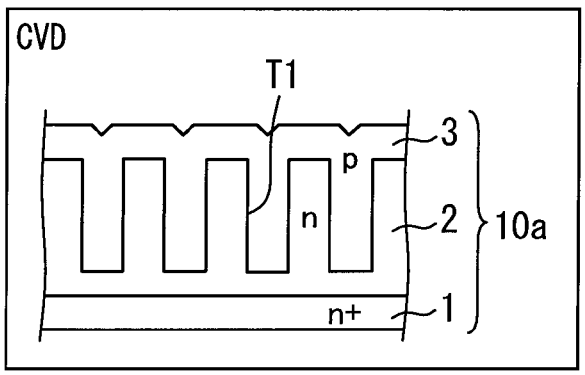

Next, after the second damage layer recover step, as shown in FIG. 3C, a trench filling step is performed. In the trench filling step, the epitaxial film 3 is formed in the trench T1. Thus, the trench T1 is filled with the epitaxial film 3. The epitaxial film 3 is formed by a CVD method with using silane gas as growing gas such as dichlorosilane ($SiH_2Cl_2$) and trichlorosilane ($SiHCl_3$) and using diborane ($B_2H_6$) as doping gas.

The second damage layer recover step in FIG. 3B and the trench filling step in FIG. 3C may be performed sequentially in the same furnace. In this case, the epitaxial film 3 is formed on the inner wall of the trench T1 immediately just after the crystallinity of the trench T1 is recovered in the second damage layer recover step in FIG. 3B. Thus, oxidation and/or foreign particle attachment, which occur between the second damage layer recover step in FIG. 3B and the trench filling step in FIG. 3C, are restricted. Accordingly, the defects according to the oxidation and/or the foreign particle attachment are not generated.

Then, the surface of the semiconductor substrate 10a is flattened by a CMP (chemical mechanical polishing) method or a etch back method, and the PN columns are formed in the substrate 10a. The PN columns provide repeat pattern of the P comductive type regions 3p and the N conductive type regions 2n alternately arranged in a surface portion of the substrate 10a.

Thus, the semiconductor substrate 10 having the PN columns in FIG. 1A is completed.

The manufacturing method of the semiconductor substrate 10 shown in FIGS. 2A to 3C includes a combination of the first damage layer removing step at low temperature in FIG. 3A and the second damage layer recover step at high temperature in FIG. 3B so that the crystallinity of the epitaxial film 3 formed in the trench T1 is improved. Further, the manufacturing method has a boundary condition for restricting the failure such as current leakage when the epitaxial film 3 is formed in the trench T1.

In the first damage layer removing step in FIG. 3A, the first damage layer D1 on the surface side of the trench T1, which is formed in the trench forming process for forming the trench T1 by the dry etching method, is etched and removed by the CDE method at temperature equal to or lower than 120° C. The chemical etching method such as the CDE method, the etching method with using radicals, the isotropic wet etching method, and the etching method in the vapor process with using the halogen gas does not generate new damage caused by the thermal stress or the accelerated ions. Thus, the first damage layer D1 is etched and removed by the chemical etching method without growing already existing defects and without generating new defects.

Next, the second damage layer recover step in FIG. 3B is performed without adding a new step between the first damage layer removing step and the second damage layer recover step, the new step that may provides damage such as crystal defects in the semiconductor substrate 10a just after the first damage layer removing step in FIG. 3A. In the second damage layer recover step, the heat treatment at temperature equal to or higher than 1050° C. in the non-oxidizing and non-azotizing gas is performed in the substrate 10a so that the crystallinity of the second damage layer D2 disposed in a surface portion of the trench T1 is recovered after the first damage layer D1 is removed. In the second damage layer recover step, the second damage layer D2 is not removed although the first damage layer D1 is removed in the first damage layer removing step. Thus, the dimensions of the trench T1 are not changed in the second damage layer recover step.

In the first damage layer removing step and the second damage layer recover step, the crystallinity of the epitaxial layer 2 around the trench T1 is sufficiently recovered before the epitaxial film 3 is formed in the trench T1. Then, the epitaxial film 3 is formed in the trench T1, so that the semiconductor substrate 10 having the PN columns is manufactured.

In the manufacturing method of the semiconductor substrate 10 shown in FIGS. 2A to 3C, not only the surface portion around the trench T1 but also the epitaxial film 3 embedded in the trench 1 have the high crystallinity without the defects. Accordingly, in the substrate 10 having the PN columns in FIG. 1A manufactured by the above method, occurrence of the leak current is restricted, so that the PN columns are completely depleted. Thus, the manufacturing method provides the semiconductor device 100 having high break down voltage.

Next, the leak defective rate of the PN columns in the semiconductor device 100 is evaluated in various etching amount E in the first damage layer removing step and various heat treatment temperature in the second damage layer recover step.

Figure 5A:
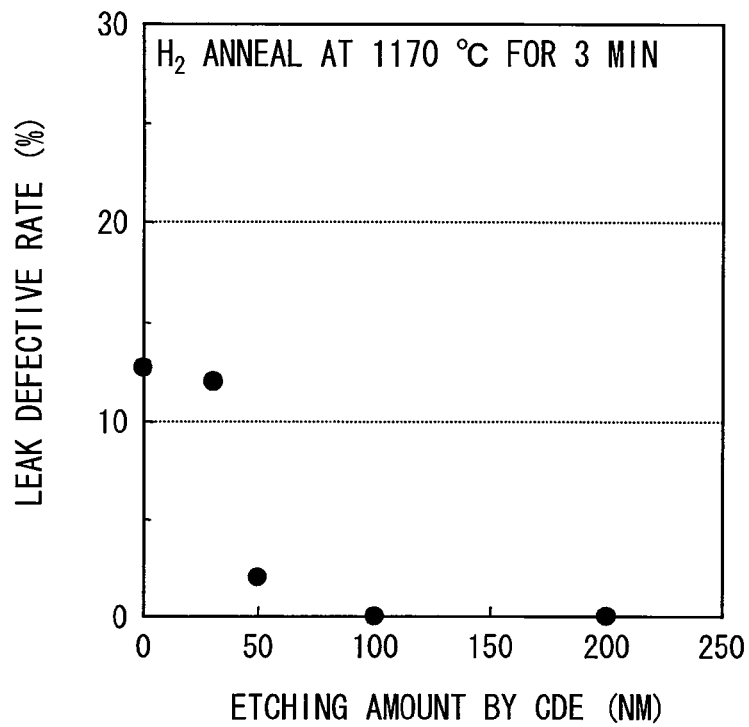
FIG. 5A is a graph showing a relationship between an etching amount and a leak defective rate in a damage layer removing step.
Figure 5B:
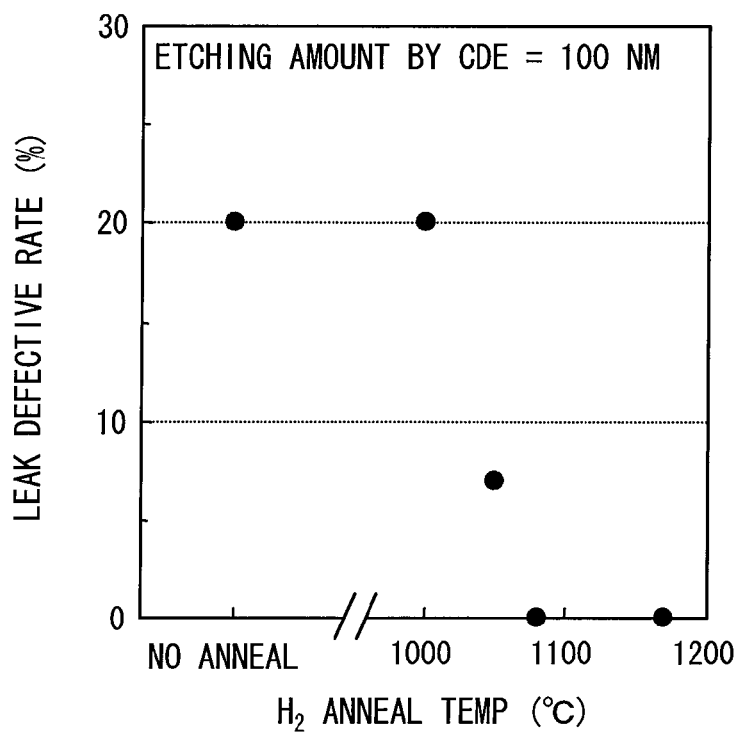
FIG. 5B is a graph showing a relationship between temperature of heat treatment and the leak defective rate in a damage layer recover step.

FIG. 5A shows a relationship between the etching amount E in the first damage layer removing step and the leak defective rate in the semiconductor device 100. FIG. 5B shows a relationship between the heat treatment temperature in the second damage layer recover step and the leak defective rate in the semiconductor device 100. In each sample of the device 100 shown in FIG. 5A, the etching is performed by the CDE method, and the heat treatment in the second damage layer recover step is performed at 1170° C. for three minutes in $H_2$ atmosphere. In each sample of the device 100 shown in FIG. 5B, the etching amount E in the first damage layer removing step is 100 nanometers, the etching is performed by the CDE method, and the heat treatment in the second damage layer recover step is performed in $H_2$ atmosphere for three minutes.

Figure 6:
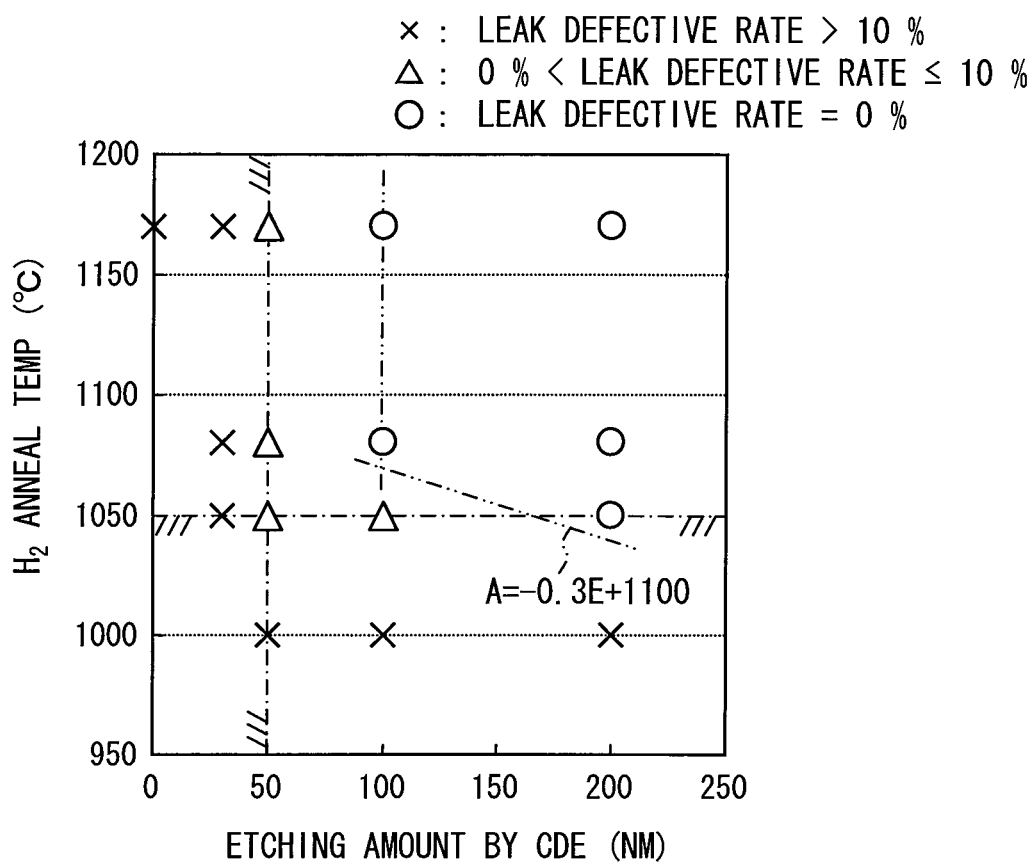
FIG. 6 is a graph showing a relationship among the temperature of heat treatment, the etching amount and the leak defective rate.

FIG. 6 shows the leak defective rate of the PN columns in the semiconductor device 100 in each of the etching amount E in the first damage layer removing step and in each of the heat treatment temperature in the second damage layer recover step.

Regarding the relationship between the etching amount E in the first damage layer removing step and the leak defective rate, as shown in FIGS. 5A and 6, when the etching amount E is smaller than 30 nanometers, the leak defective rate is larger than 10 percents. Thus, the above method does not provide any effect, and the first damage layer D1 is not removed completely. When the etching amount E is 50 nanometers, the leak defective rate is rapidly reduced to 2 percents. Further, when the etching amount E is equal to or larger than 100 nanometers, the leak defective rate becomes zero.

Thus, the thickness of the first damage layer D1 is in a range between 50 nanometers and 100 nanometers. Thus, the etching amount E shown in FIG. 4 in the first damage layer removing step is equal to or larger than 50 nanometers, which is shown on a right side of a dashed dotted line in FIG. 6, the leak defective rate is improved. Specifically, when the etching amount E in the first damage layer removing step is equal to or larger than 100 nanometers, which is shown on a right side of a dashed two-dotted line in FIG. 6, the first damage layer D1 is surely removed, and therefore, the leak defective rate becomes zero. Here, the etching amount E in the first damage layer removing step is large, the defects are completely removed. However, when the etching amount E in the first damage layer removing step is excessively large, the etching time becomes long. Thus, the etching amount E may be minimum necessary for separating adjacent trenches so that the adjacent trenches in the repeat pattern do not adhere to each other.

Regarding the relationship between the heat treatment temperature in the second damage layer recover step and the leak defective rate, as shown in FIGS. 5B and 6, when the heat treatment temperature is lower than 1000° C., the leak defective rate is larger than 20 percents. Thus, even when the etching amount E is 100 nanometers, and the first damage layer D1 is removed by the CDE method, the leak defective rate is not improved. When the heat treatment temperature is 1050° C., the leak defective rate is rapidly reduced in a range between 0 percent and 7 percents. When the heat treatment temperature is equal to or higher than 1080° C., the leak defective rate becomes zero stably.

Thus, the crystallinity of the second damage layer D2 is recovered by the heat treatment in a range between 1050° C. and 1080° C. Specifically, in FIG. 6, the etching amount in the first damage layer removing step is defined as E nanometers, and the etching amount E is equal to or larger than 100 nanometers, which is disposed on the right side of the vertical dashed two-dotted line in FIG. 6. The heat treatment temperature of the second damage layer recover step is defined as A ° C. When the etching amount E and the heat treatment temperature A are disposed on the upper side of the slant dashed two-dotted line in FIG. 6, which represents an equation of "A=−0.3×E+1100," the leak defective rate is zero.

When the heat treatment at temperature equal to or higher than 1050° C. in the non-oxidizing and non-azotizing gas is performed, the opening of the trench T1 is rounded. In this case, the epitaxial film 3 is easily embedded in the trench T1 in the trench filling step in FIG. 3C. When the heat treatment at temperature is higher than 1200° C., the shape of the trench T1 is largely deformed. For example, the trench T1 may be reverse tapered so that the width of the trench T1 is made larger as the depth from the opening of the trench T1 becomes deeper. Accordingly, the heat treatment in the second damage layer recover step may be equal to or higher than 1080° C. and equal to or lower than 1200° C. In this case, the leak defective rate attributed to the current leakage becomes zero.

Thus, the manufacturing method of the semiconductor substrate provides a method for filling the trench T1 with the epitaxial film, which has high crystallinity.

Accordingly, the manufacturing method of the semiconductor substrate is suitably used for manufacturing the semiconductor substrate having the PN columns such that the semiconductor substrate is a silicon substrate having the first conductive type, the trench is formed in the substrate at predetermined intervals so that the trench provides the repeat pattern, and the epitaxial film made of silicon and having the second conductive type is grown in the trench.

When the PN columns are formed, the width of the trench along a repeat direction of the pattern is in a range between 0.5 micro meters and 15 micro meters. The depth of the trench is in a range between 20 micro meters and 100 micro meters.

The above disclosure has the following aspects.

According to an aspect of the present disclosure, a manufacturing method of a semiconductor substrate includes: forming a trench in a semiconductor board by a dry etching method; etching a surface portion of an inner wall of the trench by a chemical etching method so that a first damage layer is removed, wherein the surface portion has a thickness equal to or larger than 50 nanometers; and performing a heat treatment at temperature equal to or higher than 1050° C. in non-oxidizing and non-azotizing gas so that crystallinity of a second damage layer is recovered, wherein the second damage layer is disposed under the first damage layer.

The above method provides a semiconductor device with the substrate having an epitaxial film embedded in the trench.

When the epitaxial film is formed in the trench, the crystallinity of the epitaxial film depends on the crystallinity of the surface of the trench, which becomes an origin of crystal growth. Accordingly, in order to remove defects in the semiconductor substrate, it is important to recover the crystallinity around the trench, which is damaged by the dry etching process before the epitaxial film is formed in the trench.

The inventors have preliminary studied about the damage around the trench. Specifically, the damage layer formed just after the trench is formed by the dry etching process includes the first damage layer and the second damage layer. The first damage layer is a high damage defect layer so that the defects expands at high temperature, and therefore, the crystallinity of the first damage layer is not recovered by the high temperature heat treatment. The second damage layer is a low damage defect layer, which is disposed under the first damage layer and reaches to a depth from the inner wall of the trench, the depth being equal to or larger than one micro meter. The crystallinity of the second damage layer can be recovered by the high temperature heat treatment. The above method includes a first damage layer removing step and a second damage layer recover step so that the crystallinity of the epitaxial film to be formed in the trench is improved. Further, when the epitaxial film is formed in the trench, a condition for restricting failure such as current leak is satisfied.

In the first damage layer removing step, the first damage layer, which is generated by the dry etching process just after the trench is formed, is removed by the chemical etching process so that the surface portion of the trench equal to or thicker than 50 nanometers is removed.

In the second damage layer recover step, the crystallinity of the second damage layer is recovered.

Thus, the crystallinity around the trench is sufficiently recovered before the epitaxial film is formed in the trench. Then, when the epitaxial film is formed in the trench, the semiconductor substrate having the PN columns as a super junction structure is manufactured.

In the above method, the surface portion around the trench has high crystallinity without defects. Thus, when an epitaxila film is formed in the trench, the epitaxial film also has high crystallinity without defects. Therefore, when PN columns are formed in the substrate, generation of leak current is restricted, so that the PN columns are completely depleted. Thus, the substrate provides a semiconductor device having high break down voltage.

Alternatively, crystallinity of the first damage layer may not be recovered by the heat treatment. The second damage layer is disposed further from the inner wall of the trench than the first damage layer. The etching of the surface portion is performed after the forming of the trench. The performing of the heat treatment is performed after the etching of the surface portion.

Alternatively, an etching amount of the surface portion in the etching of the surface portion may be defined by E nanometers, and the temperature in the performing of the heat treatment may be defined by A ° C. An equation of "E>=100" and an equation of "A>=−0.3×E+1100" are satisfied.

Alternatively, the chemical etching method in the etching of the surface portion may be performed with using a radical. Further, the chemical etching method in the etching of the surface portion may be a chemical dry etching method at temperature equal to or lower than 120° C. Furthermore, the radical may be a halogen radical as an etchant. Further, the halogen radical may be a fluorine radical, which is prepared by decomposing mixed gas of carbon tetrafluoride gas and oxygen gas according to electric discharge. Further, the temperature of the chemical dry etching method may be equal to or higher than 60° C. and equal to or lower than 100° C. Further, gas pressure of the chemical dry etching method may be equal to or higher than 0.01 Torr and equal to or lower than 10 Torr. Further, the gas pressure of the chemical dry etching method may be equal to or higher than 0.1 Torr and equal to or lower than 1 Torr.

Alternatively, the chemical etching method in the etching of the surface portion may be an isotropic wet etching method. Further, an etchant of the wet etching method may be nitric hydrofluoric acid or mixed acid of hydrofluoric acid and acetic acid.

Alternatively, the chemical etching method in the etching of the surface portion may be an etching method of a vapor process with using halogen gas. Further, the halogen gas may be hydrogen fluoride gas, hydrogen chloride gas, or chlorine gas.

Alternatively, the temperature in the performing of the heat treatment may be equal to or higher than 1080° C. and equal to or lower than 1200° C. Alternatively, heat treatment time in the performing of the heat treatment may be equal to or longer than three minutes. Alternatively, atmosphere in the performing of the heat treatment may include hydrogen gas. Alternatively, the forming of the trench may be performed with using a mask made of an oxide film or a nitride film. The mask is removed by a wet etching method before the performing of the heat treatment. Alternatively, the trench formed in the forming of the trench may have a tapered shape.

Alternatively, the manufacturing method of the semiconductor substrate may further include: forming an epitaxial film in the trench so that the trench is filled with the epitaxial film after the performing of the heat treatment. Further, the performing of the heat treatment and the forming of the epitaxial film may be sequentially performed in a same furnace. Further, the semiconductor board may be a silicon substrate having a first conductive type. The trench in the forming of the trench has a repeat pattern so that a plurality of trench portions are repeatedly arranged at predetermined intervals on a surface of the semiconductor board. The epitaxial film in the forming of the epitaxial film is made of silicon having a second conductive type. Further, a width of each trench portion along a repeat direction may be equal to or larger than 0.5 micro meters and equal to or smaller than 15 micro meters, and a depth of each trench portion may be equal to or larger than 20 micro meters and equal to or smaller than 100 micro meters.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A manufacturing method of a semiconductor substrate comprising:
    forming a trench in a semiconductor board by a dry etching method;
    etching a surface portion of an inner wall of the trench by a chemical etching method so that a first damage layer is removed, wherein the surface portion has a thickness equal to or larger than 50 nanometers; and
    performing a heat treatment at temperature equal to or higher than 1050° C. in non-oxidizing and non-azotizing gas so that crystallinity of a second damage layer is recovered, wherein the second damage layer is disposed under the first damage layer, wherein
    crystallinity of the first damage layer is not recovered by the heat treatment,
    the second damage layer is disposed further from the inner wall of the trench than the first damage layer,
    the etching of the surface portion is performed after the forming of the trench, and
    the performing of the heat treatment is performed after the etching of the surface portion.

2. The manufacturing method of the semiconductor substrate according to claim 1,
    wherein an etching amount of the surface portion in the etching of the surface portion is defined by E nanometers,
    wherein the temperature in the performing of the heat treatment is defined by A ° C., and
    wherein an equation of "E>=100" and an equation of "A>=−0.3×E+1100" are satisfied.

3. The manufacturing method of the semiconductor substrate according to claim 1, wherein the chemical etching method in the etching of the surface portion is performed with using a radical.

4. The manufacturing method of the semiconductor substrate according to claim 3,
wherein the chemical etching method in the etching of the surface portion is a chemical dry etching method at temperature equal to or lower than 120° C.

5. The manufacturing method of the semiconductor substrate according to claim 4,
wherein the radical is a halogen radical as an etchant.

6. The manufacturing method of the semiconductor substrate according to claim 5,
wherein the halogen radical is a fluorine radical, which is prepared by decomposing mixed gas of carbon tetrafluoride gas and oxygen gas according to electric discharge.

7. The manufacturing method of the semiconductor substrate according to claim 6,
wherein the temperature of the chemical dry etching method is equal to or higher than 60° C. and equal to or lower than 100° C.

8. The manufacturing method of the semiconductor substrate according to claim 6,
wherein gas pressure of the chemical dry etching method is equal to or higher than 0.01 Torr and equal to or lower than 10 Torr.

9. The manufacturing method of the semiconductor substrate according to claim 8,
wherein the gas pressure of the chemical dry etching method is equal to or higher than 0.1 Torr and equal to or lower than 1 Torr.

10. The manufacturing method of the semiconductor substrate according to claim 1,
wherein the chemical etching method in the etching of the surface portion is an isotropic wet etching method.

11. The manufacturing method of the semiconductor substrate according to claim 10,
wherein an etchant of the wet etching method is nitric hydrofluoric acid or mixed acid of hydrofluoric acid and acetic acid.

12. The manufacturing method of the semiconductor substrate according to claim 1,
wherein the chemical etching method in the etching of the surface portion is an etching method of a vapor process with using halogen gas.

13. The manufacturing method of the semiconductor substrate according to claim 12,
wherein the halogen gas is hydrogen fluoride gas, hydrogen chloride gas, or chlorine gas.

14. The manufacturing method of the semiconductor substrate according to claim 1,
wherein the temperature in the performing of the heat treatment is equal to or higher than 1080° C. and equal to or lower than 1200° C.

15. The manufacturing method of the semiconductor substrate according to claim 1,
wherein heat treatment time in the performing of the heat treatment is equal to or longer than three minutes.

16. The manufacturing method of the semiconductor substrate according to claim 1,
wherein atmosphere in the performing of the heat treatment includes hydrogen gas.

17. The manufacturing method of the semiconductor substrate according to claim 1,
wherein the forming of the trench is performed with using a mask made of an oxide film or a nitride film, and
wherein the mask is removed by a wet etching method before the performing of the heat treatment.

18. The manufacturing method of the semiconductor substrate according to claim 1,
wherein the trench formed in the forming of the trench has a tapered shape.

19. The manufacturing method of the semiconductor substrate according to claim 1, further comprising:
forming an epitaxial film in the trench so that the trench is filled with the epitaxial film after the performing of the heat treatment.

20. The manufacturing method of the semiconductor substrate according to claim 19,
wherein the performing of the heat treatment and the forming of the epitaxial film are sequentially performed in a same furnace.

21. The manufacturing method of the semiconductor substrate according to claim 19,
wherein the semiconductor board is a silicon substrate having a first conductive type,
wherein the trench in the forming of the trench has a repeat pattern so that a plurality of trench portions are repeatedly arranged at predetermined intervals on a surface of the semiconductor board, and
wherein the epitaxial film in the forming of the epitaxial film is made of silicon having a second conductive type.

22. The manufacturing method of the semiconductor substrate according to claim 21,
wherein a width of each trench portion along a repeat direction is equal to or larger than 0.5 micro meters and equal to or smaller than 15 micro meters, and
wherein a depth of each trench portion is equal to or larger than 20 micro meters and equal to or smaller than 100 micro meters.

* * * * *